United States Patent

Kasai et al.

Patent Number: 5,728,481
Date of Patent: Mar. 17, 1998

[54] SPIN INTERACTION DEVICE

[75] Inventors: Masahiro Kasai, Mito; Yuzo Kozono, Hitachiota; Yoko Kanke, Katsuta; Toshiyuki Ohno, Hitachi; Masanobu Hanazono, Mito, all of Japan

[73] Assignee: Hitachi, Ltd., Tokyo, Japan

[21] Appl. No.: 467,317

[22] Filed: Jun. 6, 1995

Related U.S. Application Data

[62] Division of Ser. No. 936,640, Aug. 28, 1992, abandoned.

[30] Foreign Application Priority Data

Aug. 30, 1991 [JP] Japan .................. 3-219595

[51] Int. Cl.$^6$ .................................................. G11B 5/66
[52] U.S. Cl. .................. 428/694 ML; 428/694 RE; 428/694 SC; 428/694 MN; 428/694 IS; 428/701; 428/702; 428/900; 428/694 TM; 501/152; 501/126; 505/190; 505/238
[58] Field of Search .................. 505/190, 238; 428/694 ML, 694 RE, 694 SC, 694 MM, 694 IS, 694 TM, 701, 702, 900; 501/152, 126

[56] References Cited

U.S. PATENT DOCUMENTS 4,883,710  11/1989  Machida .................. 428/336
5,077,270  12/1991  Takeda .................. 501/100

Primary Examiner—Leszek Kiliman
Attorney, Agent, or Firm—Antonelli, Terry, Stout, & Kraus, LLP

[57] ABSTRACT

A magnetic detecting device is constructed of a substrate, a first magnetic layer formed on the substrate, a first magnetic layer formed on the substrate, an intermediate layer containing an atom indicative of weak spincoupling and formed on the first magnetic film, and a second magnetic layer formed on the intermediate layer. The magnetic detecting device further comprises a unit or supplying a current through the first and second magnetic layers, and a unit for detecting a voltage generated between the first magnetic layer and the second magnetic layer while the current is supplied thereto.

13 Claims, 5 Drawing Sheets

SPIN INTERACTION DEVICE

This is a division of application Ser. No. 07/936,640, filed Aug. 28, 1992 now abandoned.

BACKGROUND OF THE INVENTION

The present invention generally relates to a laminated film with employment of a magnetic substance or material, and more specifically, to a spin interaction device with using this laminated film and a high sensitivity.

The conventional laminated film with employment of the magnetic substance, or material is such a laminated film made of Fe (30A°)/Cr (9A°)/Fe (30A°) as described in the publication of Japan applied magnetic institute No. 69, in 1991, pages 21 to 26. Also, there is described such a laminated film in Physical Review Letters, Vol. 61, No. 21, pages 2472–2475, 1988. Further, there is described such a laminated film as, for instance, Ni/NiO/Ni on IEEE Transactions on Magnetics, Vol. Mag-18, No. 2, Pages 707–708, March in 1982.

In the spin interaction devices using the conventional laminated films, a magnetoresistance effect happens to occur only under strong magnetic field higher than 1,000 Oersteds. It is very difficult to provide a spin interaction device having a high sensitivity with respect to a weak magnetic field.

SUMMARY OF THE INVENTION

An object of the present invention is to provide a spin interaction device having a high sensitivity, and with employment of such a laminated film that there is an intermediate layer between magnetic materials.

A spin interaction device, according to the present invention, is characterized in that a magnetic oxide is employed as a magnetic material, or substance, and an intermediate layer is present between these magnetic materials.

The spin interaction device, according to the present invention, implies that this spin interaction utilizes such an interaction phenomenon that a spin of a magnetic element of one magnetic oxide interacts with a spin of a magnetic element of the other magnetic oxide via an intermediate layer, and as this magnetic element, there as Mangan, Cobalt, and iron etc.

In a magnetic material or substance, a magnetic mutual action, namely a spin interaction occurs among spins of a magnetic element, and therefore the magnetic material represents either ferromagnetism, or antiferromagnetism. Assuming now that a direction of a certain spin is "+" and a direction of a spin opposite to the first-mentioned direction is "−", when such a manner that the respective spins are ordered along the "+" and "−" directions, this magnetic material represents antiferromagnetism. To the contrary, when such an interaction is produced in such a manner that these spins are ordered along the "+" and "+" directions, this magnetic material represents ferromagnetism. As described above, the spin interaction effect is produced between two magnetic materials. However, if these two magnetic materials are present independently from each other, then no interaction is produced therebetween. Thus, such an intermediate layer as in the present invention is required which has a function to transfer the spin mutual effect from one magnetic material to the other magnetic material.

Under such a circumstance that the spin interaction effect is produced via the intermediate layer between two magnetic materials, this spin interaction effect represent a reaction at a high sensitivity with respect to energy stimulation externally given thereto, namely electromagnetic waves, magnetic fields, light, pressure, sound, and heat. When a current is flown through such a state that the above-described spin interaction effect is produced, electrons are scattered by the spins and variations in the interaction effects are detected as changes in electrical resistance values. The spin interaction device according to the present invention can detect externally given energy at a high sensitivity by utilizing the above-explained changes in the electrical resistance values.

It is preferable for the intermediate layer existing between the magnetic materials to contain atoms indicative of weak spin interaction. An atom indicative weak spin interaction implies, for instance, a copper atom in an oxide, in which although there are spin interaction effects among the atoms, since degrees of the spin interaction effects are lower than those of the general ferromagnetic materials, these atoms do not represent strong magnetization. The spin interaction effect of the above-described intermediate layer is different from that of the general magnetic material. Since a degree of force to order the spins along the "+" and "−" directions is substantially equal to that to order the spins along the "+" and "+" directions, the above-described two spin conditions are alternately repeated when an attention is given to the spins of the adjoining atoms. Such spin conditions will be referred to "Spin fluctuating conditions". The spin fluctuating conditions may be conceived as such a state that the overall spins are waving to some extent. In accordance with the spin interaction device of the present invention, the spin interaction effects by two magnetic materials are utilized by employing such an intermediate layer having the above-described fluctuated conditions. Even when substances made of such as Ti, W, and Ta corresponding to atoms having no fluctuation are employed as the intermediate layer, the above-described spin interaction effects do not occur.

Also, it is preferable for the intermediate layer present between the magnetic substances, or materials to contain atoms with weak spin interaction effects. The atoms with weak spin interaction effects imply such atoms whose a degree of force to order spins is lower than that of ferromagnetic material element, or antiferromagnetic material element. The atoms with weak spin interaction effects correspond to magnetic elements of manganese and chromium under such a condition that these magnetic elements are diluted by a non-magnetic element, or copper in an oxide. The above-described conditions of the weak spin interaction involve a generally known condition as a spin glass phase.

Furthermore, the intermediate layer present between the magnetic materials preferably contains atoms having great fluctuation. The atoms having great fluctuation are known as, for instance, magnetic elements such as iron, cobalt, and manganese, and also copper atoms contained in an oxide. In these intermediate layers, the atoms having the spins are brought into such a state generally referred to as a mixed valence. A valence is used when a certain atom is brought into such a condition that this atom is present not at a ground state, rather at a state with less electron. If electrons are less than the normal electrons by 1, it is called as a "monovalence", whereas if electrons are less than the normal electrons by 2, it is called as "dievalence". As an explanation is made of, for instance, copper, there are two different valences of copper, namely dievalence and trivalence, and atoms having these two sorts of valences are present at a predetermined ratio. Weak spin interaction effect having antiferromagnetism is produced among two sorts of copper atoms. However, since this interaction effect is weak.

spins of the copper atoms are brought into the above-described fluctuated state. Furthermore, if an attention is given to a specific atom, the atoms alternately take dievalence and trivalence. This condition is called as fluctuation of an electric charge. The spin interaction device of the present invention utilizes such an effect that the above-explained spin and electric charge fluctuation causes the spin interaction effect of one magnetic material to be transferred to the other magnetic material.

Also, it is preferable as the intermediate layer, to employ an oxide having a perovskite structure.

Materials used as the intermediate layer are preferabrably expressed by a generic formula:

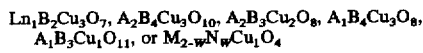

$Ln_1B_2Cu_3O_7$, $A_2B_4Cu_3O_{10}$, $A_2B_3Cu_2O_8$, $A_1B_4Cu_3O_8$, $A_1B_3Cu_1O_{11}$, or $M_{2-w}N_wCu_1O_4$

It should be noted that symbol "A" indicates at least one of elements Tl, Bi, Pb; symbol "B" represents at least one sort of alkaline-earth metal; symbol "M" denotes any one of elements La and Nd; symbol "N" shows any one sort of elements Ce or alkaline-earth metal; symbol "Ln" is at least one of elements a rare earth metal, Y, and trivalence element; and also symbol "w" is selected to be 0.05 to 1.00.

Furthermore, concretely, it is preferable for the material used as the intermediate layer to employ the following materials:

$(La_{1-x}M_x)Cu_2O_4$ (Symbol "M" is at least one of elements Ba, Ca, Sr), $La_1Ba_2Cu_3O_7$, $La_2NaCuO_4$, $Bi_{0.1}La_{1.8}Sr_{0.1}CuO$, $La_2CuO_4$, $La_2Ba_3LuCu_6O$, $YBa_2Cu_3O_7$, $Y_2Ba_4Cu_8O_{20}$, $Yb_2Ba_4Cu_7O_{15}$, $Bi_2Sr_2CuO_6$, $Bi_2Sr_2Ca_1Cu_2O_8$, $Bi_2Sr_2Ca_2Cu_3O_{10}$, $Bi_2Sr_2Ca_3Cu_4O_{12}$, $Ba(Pb_{1-x}Bi_x)O_3$, $(Ba_{1-x}K_xBiO_3$, $(Bi_{1-x}Pb_x)_2Sr_2Ca_2Cu_3O$, $Bi_2Sr_{2.6}Nd_{0.4}CuO_8$, $Tl_2Ba_2CuO_6$, $Tl_2Ba_2Ca_1Cu_2O_8$, $Tl_2Ba_2Ca_2Cu_3O_{10}$, $Tl_1Ba_2Ca_1Cu_2O_6$, $Tl_1Ba_2Ca_3Cu_4O_8$, $Tl_1Ba_3Ca_2Cu_4O_{10}$, $Tl_1Sr_2Ca_2Cu_3O_9$, $(Tl_{0.5}Pb_{0.5})Sr_2Ca_2Cu_3O_8$, $Nd_{1.6}Sr_{0.2}Ce_{0.2}CuO_4$, $Nd_{0.8}Ce_{0.2}Cu_1O_4$, $Ca_{0.8}Sr_{0.2}Cu_1O_2$, $(Tl_{0.75}Bi_{0.25})_{1.3}(Sr_{0.5}Ca_{0.5})_{2.7}Cu_2O_8$, $Pb_2Sr_2Y_{0.5}Ca_{0.5}Cu_3O_8$.

where symbol "M" indicates at least one of elements Ba, Ca, Sr, and symbol "x" is selected to be 0.05 to 1.0, and also symbol (A B) implies that at least one of A and B is contained.

Further, the intermediate layer is preferably made of such a substance indicative of a superconducting characteristic when the temperature of the materials employed in this intermediate layer is lowered.

The Inventors (Applicants) have proceeded with their research about interaction effects caused when a superconducting oxide is positioned close to a magnetic material, since it is important for clarify an occurring mechanism of a high-temperature superconducting phenomenon. As a result of such a research, it could be found out such a specific proximity effect that a superconducting current may flow through the magnetic material only in a limited magnetic region (x=0.2 to 0.3) among $La_{1-x}Ca_xMnO_z$(LCMO) and $La_{1-x}Sr_xMnO_z$(LSMO) belonging to the manganese oxide magnetic materials having the perovskite structure, and $YBa_2Cu_3O_y$(YBCO) belonging to the high-temperature oxide superconducting material. This proximity effect is a novel phenomenon in view of the following three points:

(1). A superconducting current flows through a barrier layer whose length greatly exceeds a coherent length.

(2). When a barrier layer having a semiconductive electric characteristic is sandwiched by an oxide superconductor, a junction resistance represents metallic behavior.

(3). Both of ferromagnetism and superconducting current are commonly present, or commonly appear.

The Inventors could find out that since the spin interaction effects have already been produced between the superconducting oxide and the oxide magnetic material even at a room temperature, the junction resistance indicates the metallic characteristic, while analyzing this specific phenomenon. Based upon the above-described recognition, the spin interaction device according to the present invention can be realized.

The thickness of the intermediate layer is selected from 0.01 to 1.0 μm, preferably 0.1 to 1.0 μm. This is because the spin interaction device can be easily formed, and thickness of the intermediate layer may be made thick. This is the effect to employ the intermediate layer having the spin fluctuation.

On the other hand, it is preferable as the magnetic materials to sandwich the intermediate layer, to employ an oxide magnetic material having an electron spin of a magnetic element. In particular, it is preferable to use an oxide magnetic material having a perovskite structure.

Also it is preferable as the oxide magnetic material to employ the following material expressed by the generic formula:

$ABO_3$ (Note that symbol "A" indicates at least one sort of elements selected from trivalence element and alkaline-earth metal, and symbol "B" denotes at least one of magnetic elements such as Fe, Co, Ni, Cr, Mn).

Concretely, the oxide magnetic materials used in the present invention may be preferably selected from the following materials:

$(La, Ca)_1Mn_1O_y$, $(La, Sr)_1Mn_1O_y$, $Bi_1Mn_1O_y$, $Ba_1Fe_1O_y$, $Sr_1Co_1O_y$, $(La, A)_1B_1O_y$ (symbol "A" indicates at least one of elements Ba, Sr, Pb, Cd, and symbol "B" represents at least one of elements Mn, Co);

$(La,A)_1B_1C_1O_y$ (symbol "A" represents at least one sort of rare-earth element, and symbol "B" shows at least one sort of alkaline-earth element, and symbol "C" denotes at least one of elements Fe, Co, Mn, Ni, Cr, Co);

$\{(Pr,Nd),(Ba,Sr)\}_1Mn_1O_y$, $(Bi,Ca)_1Mn_1O_y$, $La_1(M,Mn)_1O_y$ (symbol "M" indicates at least one of elements Co, Ni, Cu, Cr), $Gd_1(Co,Mn)_1O_y$, $A_1(Fe,B)_1O_y$ (symbol "A" is at least one of elements Ba, Ca, Sr, symbol "B" is at least one of elements Mo, Mn), $Bi_1CR_1O_y$, $Ca_1Ru_1O_y$, $A_1(B,C)_1O_y$ (symbol "A" denotes at least one of elements Ba, Ca, Sr, Pb, symbol "B" represents at least one of element Ni, Mn, Cr, Fe, and symbol "C" shows at lest one of elements W, Sb, Mo, U);

$(Sr,La)_1(C,D)_1O_y$ (symbol "C" denotes at least one of elements Co, Ni, and symbol "D" indicates at least one of Nb, Sb, Ta, and "y" is selected from 2.7 to 3.3). It should be noted that (A,B) implies that at least one of A and B is involved.

Also, the spin interaction device according to the present invention is characterized in that this device has a coupling layer made of an oxide with a perovskite structure between the magnetic materials.

It should be noted that the coupling layer implies such a layer with a function to transfer a spin of one magnetic material to another magnetic material in order to produce a spin interaction effect between the magnetic materials. An oxide having a perovskite structure, which corresponds to the coupling layer employed in the spin interaction device according to the present invention, owns spin fluctuation.

The Invertors could find out, during the steps of researching the proximity effect, the possibilities that the superconducting oxide may be used as the above-described coupling layer. This proximity effect is such that in a junction of three-layer structure wherein an Mn oxide magnetic material $La_{1-x}(Sr,Ca)_xMnO_{3-z}$ is used as a barrier layer and sandwiched by $YBa_2Cu_3O_y$ (YBCO). This proximity effect has a close relationship with the spin state of $La_{1-x}(Sr,Ca)_xMnO_{3-z}$. When a difference between spin conditions of Mn at 77 k with respect to a tri layered (three-layer) film of $YBa_2Cu_3O_y/La_{0.8}Sr_{0.2}MnO_{3-2}(LSMO)/YBa_2Cu_3O_y$ and also a single layer film of $La_{0.8}Sr_{0.2}MnO_{3-z}$, is investigated by way of the FMR (Ferromagnetic Spin Resonance), a result shown in FIG. 8 could be obtained. It can be recognized two sorts of peaks in any of the three-layer film and the single layer film. In FIG. 9, there is shown a result of a full width of a half maximum depending upon temperature with regard to the above-described peaks. Although no temperature change appears in the LSMOS single-layer film (○) a high peak (maximum) is represented proximity of 150 k in the three-layer film (●), so that there is a particular difference between them. The full width of a half maximum of the peak indicates a degree of the above-explained spin fluctuation, and corresponds to such a result indicating that there is a change in a spin dynamic characteristic by laminating the oxide magnetic material with the superconducting oxide. The present invention is accomplished based upon the above-described spin characteristic.

Then, the spin interaction device according to the present invention is characterized by comprising a laminated layer film with a three-layer structure constructed by sandwiching oxide by magnetic materials, means for supplying a current between the magnetic materials, and means for detecting a voltage produced between these magnetic materials. The laminated layer film is such a laminated layer film with a three-layer structure where oxide made of a superconducting oxide is sandwiched by magnetic materials. Conventionally, a device having a three-layer structure in which a non-superconducting material having a thickness of on the order of several tens angstroms is known as a Josephson device. However, the spin interaction device according to the present invention owns such a structure that a superconducting material is sandwiched by non-superconducting materials, and is completely different from the Josephson device in view of structures and also principles thereof. In particular, according to the present invention, the spin interaction device is characterized by utilizing the characteristics of the superconducting material at a higher temperature than a critical temperature of superconducting transition at which a superconducting oxide indicates the superconducting characteristic. More specifically, the spin interaction device of the present invention may be used under a room temperature state.

Also, a spin interaction device according to the present invention is characterized by comprising a laminated-layer film with a three-layer structure constructed by sandwiching oxide with magnetic materials; means for supplying a current between these magnetic materials; means for detecting a voltage produced between the magnetic materials; and means for externally applying energy to the laminated-layer film. The means for supplying the current between the magnetic materials implies a constant current source capable of flowing a constant current, in which a current is supplied via an electrode made of either gold or silver. A voltage generated at this time is monitored by a voltmeter. A terminal to detect the voltage may be commonly used as a terminal to supply a current.

When energy such as an electromagnetic wave, a magnetic field, light, a sound, pressure and heat is externally applied to the above-described spin interaction device, a spin state is changed with a high sensitivity. Since this spin state change can be read as a change of a voltage, the spin interaction device may be utilized as a detecting device with a high sensitivity. Also, this spin interaction device may be utilized as a device capable of using the electromagnetic wave produced when the current flows through the magnetic materials.

Furthermore, the present invention is to provide a magnetic detecting device comprising a laminated layer film made by laminating a magnetic material formed on a substrate, with a magnetic material formed via oxide on the first-mentioned magnetic material; means for flowing a current between these magnetic materials; and means for detecting a voltage appearing between the magnetic materials, and for detecting magnetism by way of a change in a resistance value of the laminated-layer-film when this laminated-layer film receives the magnetism.

In case that the above-described spin interaction device constructed of the laminated-layer film is employed as the magnetic detecting device, the following utilization is performed.

In the laminated-layer film with the three-layer structure in which the oxide is sandwiched by the magnetic materials, an electrode for flowing a current from one magnetic material layer to the other magnetic material layer is provided and then connected to the means for supplying the current. Furthermore, the electrode for detecting the voltage produced at a junction part of the three-layer structure of the film is connected to the means for detecting the voltage. When a magnetic field is applied to the above-described spin interaction device in parallel to a film surface of the three-layer laminated film, the voltage generated at the junction part is varied. By monitoring the generated voltage, the above-explained spin interaction device may be utilized as the magnetic detecting device. In the above-explained laminated layer film with the three-layer structure, a film thickness of an oxide layer corresponding to the intermediate layer may be made up to one the order of 1 micron.

Moreover, the present invention is to provide a magnetic detecting device comprising a laminated-layer film with a three-layer structure in which oxide formed on a substrate is sandwiched by magnetic materials; means for supplying a current along a direction of film surfaces of these magnetic materials; and means for detecting a voltage generated between these magnetic materials, and for detecting magnetism by way of a change in resistance values of the laminated-layer film when this laminated layer film receives the magnetism.

To this end, both of two current terminals for supplying the current along a longitudinal direction within the film surfaces, and two voltage terminals for detecting the voltage produced when the current flows are formed. These terminals are fixed on the supporting member and furthermore connected to a current supplying means and a voltage detecting means. Under such a circumstance, when the magnetic field is externally applied to this magnetic detecting device, the voltage between the voltage terminals will be changed in response to a magnitude of the applied magnetic field, so that the magnetic field can be detected. The above-described terminals may be commonly used as the voltage terminal and the current terminal. Also, the laminated-layer film with the three-layer structure may be substituted by a multi-layer film having more than three layers.

A voltage changing rate at this time is very layer than that of the conventional magnetic resistance element by more than 1 order, namely is about 50 to 90% of the conventional value. A resistivity of an oxide magnetic material is approximately 100 mΩ/cm at a room temperature, and an absolute value of the generated voltage is considerably greater than that of the conventional magnetic resistance element by more than 3 orders. As a consequence, a magnetic detecting element having a better S/N ratio according to the present invention can be achieved. Since the current value of the magnetic detecting device under operation may be reduced to several tens microamperes, therefore, the heating phenomenon at the electrode parts can be suppressed, and also no deterioration in the magnetic resistance film happens to occur due to the heating phenomenon.

The magnetic detecting device of the present invention utilizes a so-called "magnetic resistance effect" in a magnetic head. This magnetic head is of a reading/writing separating type head which has an object to establish a magnetic recording apparatus with a high density and a large recording capacity. The magnetic resistance effect is such a phenomenon that when a single-axis anisotropic magnetic field is being applied to the ferromagnetic thin film within the surface of the thin film, and the external magnetic field is applied normal to the film surface, the resistance values are varied.

The magnetic head employing the magnetic detecting device has a high S/N ratio and is not influenced by a so-called "Barkhausen noise" which is produced when magnetic domain walls are moved, caused when the magnetization direction is different in the magnetic film.

The metal ferromagnetic material such as a permalloy (Ni—Fe) has been mainly utilized as the ferromagnetic film, namely the magnetic resistance film used in the conventional magnetic heady However, according to the present invention, there is no necessity to reduce the resistivity of the magnetic material to several tens microohm/cm. Conventionally, to obtain a high reproducing output, the thickness of the magnetic resistance film of the device is very thin, e.g., below than several hundreds angstroms. However, in accordance with the present invention, the thickness of the magnetic resistance film is not made so thin. Either, it is no required to increase the value of the current flowing through the device. As a result, no requirement is made to form such a thin film, and there is no problems that the sensitivity is lowered which is caused by increasing a coercive force due to a pin hole formed in the film. Moreover, since a large current needs not be flown, there is no problem that deterioration of the device caused by the heating phenomenon is emphasized.

Also, another magnetic detecting element has been proposed that which utilizes a "giant magnetic resistance effect" that is different from the phenomenon of the above-described magnetic resistance effect. This "giant magnetic resistance effect" implies such a phenomenon that an extremely large magnetic resistance effect appears in a 3-layer laminated-layer film with a structure in which an non-magnetic material is sandwiched by ferromagnetic materials. This giant magnetic resistance effect happens to occur due to such a fact that both of the upper ferromagnetic material and the lower ferromagnetic material cause the spin interaction effect via the non-magnetic layer. In accordance with the present invention, the magnetic detecting device utilizing this phenomenon can solve such a problem that although a large reproduced output may be expected, a detection sensitivity is low. That is to say, contrary to such a fact that the giant magnetic resistance effect does not occur unless a magnetic field with on the order of 1000 Oersteds is externally applied, according to the present invention, the magnetic resistance effect can be produced even under, for instance, a low magnetic field of 30 Oersteds, and then the magnetic field derived from the actual magnetic recording medium can be read. Also, since the thickness of the non-magnetic layer needs not be made thinner than several tens angstroms as in the conventional giant magnetic resistance effect, the device characteristic can be easily controlled.

Furthermore, there is a ferromagnetic tunnel junction device belonging to the magnetic detecting device constructed by the principle different from the above-described magnetic detecting device. This tunnel junction device is so constructed that an insulator having a very thin film thickness of several tens of angstroms is sandwiched by a ferromagnetic thin film, and thus may be utilized as a high output utilized as a high output and high sensitivity magnetic detecting device. Although the above-described ferromagnetic tunneling phenomenon occurs only under ultra low temperatures so that it is very difficult to utilize such a tunneling phenomenon as the conventional magnetic detecting device, such a conventional problem can be solved by the present invention and the ferromagnetic tunnel junction device of the present invention may be operated even under the room temperature.

The Inventors could find out during the research of the high-temperature superconducting mechanism that the spin interaction effect is produced over a long distance longer than 2 micrometer between the superconducting oxide having the perovskite structure and the magnetic oxide, and also this spin interaction effect is still in force even at a temperature higher than the critical temperature of the superconducting transition at which the superconducting material is transferred to the superconducting state. The present invention has been made by utilizing the above-described spin interaction effect to realize a magnetic detecting device with a high sensitivity, and also can realize a magnetic recording apparatus with a high density and a large recording capacity.

The present invention is to provide a magnetic recording apparatus for reading a magnetic signal recorded on a magnetic signal recorded on a magnetic recording medium by a magnetic detecting device, and comprising a laminated film with a three-layer structure in which the above-described magnetic detecting device sandwiches an oxide with a magnetic substance, in which the laminated film reads the magnetic signal recorded on the magnetic recording medium. When the magnetic detecting device is positioned in proximity to the magnetic recording medium on which the information has been recorded, for instance, detected voltages or the like of the magnetic detecting device are varied in response to the magnetic field from the magnetic recording medium, so that the information written into the magnetic recording medium can be read.

Moreover, the present invention is to provide a method for using a spin interaction device with a superconducting material between magnetic oxide materials, and for using such a spin interaction device at a higher temperature than a critical temperature of superconductive transition of the above-described superconducting materials.

The spin interaction device according to the present invention may be employed as a recording device for a calculation system of a large-scale computer and a personal computer and the like. Also, this spin interaction device may be used as either a recording apparatus, or a recording device for an optical communication system and a optical calculation system.

When these magnetic oxide materials and superconducting oxide are laminated to fabricate a laminated-layer film with a three-layer structure by preferably utilizing the sputtering method, ion-beam sputtering method and vapor deposition method. Further, these materials may be formed on such a substrate as a strontium titanate single crystal (monocrystal) substrate, a magnesium oxide single crystal substrate, and a zirconium oxide single crystal substrate. As a substrate to be fabricated, there are preferably employed a glass substrate, a silicon single crystal substrate, a gallium arsenide single crystal substrate, and a gadolinium gallium garnet monocrystal substrate. At this time, the thickness of the superconducting layer is preferably higher than 100 angstroms. The respective magnetic material layers and the respective superconducting material layers may be mutually grown by an epitaxial azimuth relation. This is because the strength of the spin interaction effect represents crystal azimuth dependency.

When the laminated film is fabricated, the temperature of the substrate is set to an optimum temperature between 500° and 650° C., and the substrate is conducted into oxide atmosphere ($O_2$, $O_3$, $N_2O$) so as to form this laminated film. After the laminated film has been formed, an $O_2$ gas is conducted to cool this film in a natural way. If the laminated film is fabricated by the sputtering method, a sintering target with a preselected component ratio is employed, whereas if the laminated film is fabricated by the vapor deposition method, either a metal, or alloy vapor deposition source with a preselected component is employed.

To employ the magnetic detecting device according to the present invention in the magnetic recording apparatus, the following arrangement is required. That is, a means for supplying a current to the magnetic detecting device is connected to a means for detecting a voltage of the device, and a device for writing an information signal into a magnetic recording medium, namely, a so-called "recording magnetic head" is mounted on the same supporting member, which is independent from the above magnetic detecting device. The supporting member is arranged in such a manner that the device is moved by a driving mechanism controlled by a control unit to a predetermined position of the magnetic recording medium, and therefore the information signal can be written and/or read. As a consequence, a compact magnetic recording apparatus with a high density and a large memory capacity can be obtained.

In case that the laminated film according to the present invention is utilized to the device, this device is preferably used at a higher temperature than the critical temperature of the superconducting transition of the superconducting material. This is because the specific spin interaction effect discovered by the Inventors is produced within this temperature range. Since the laminated film according to the present invention is used within the above-described temperature range, the magnetic detecting device with the high sensitivity and the high output can be obtained, which could not be realized in prior art.

The spin interaction effect is produced via the superconducting material between the non-superconducting materials by employing the laminated film with the three-layer structure in which the superconducting material is sandwiched by the non-superconducting materials.

Also, the above-described spin interaction effect is in effective over the long distance even at the room temperature by employing the magnetic oxide material as the above-described non-superconducting material and the superconducting oxide material as the superconducting material. As a consequence, it may cause that the giant magnetic resistance effect occurs in the laminated-layer film of the magnetic oxide and it may be provided a device with a high sensitivity and a high output, which is usable as the magnetic detecting element.

In the laminated-layer film made of the superconducting oxide material and the magnetic oxide material, such a fact that the thickness of the respective layers exceeds 100 angstroms may cause the uniform device characteristic to be obtained. This is because the laminated-layer film made of the superconducting oxide material and the magnetic oxide material which may induce the long-distance spin interaction discovered by the Inventors.

Also, in the three-layer film with such a structure in which the superconducting material formed on the substrate is sandwiched by the magnetic materials, such a fact that the current is flown from the upper magnetic material layer to the lower magnetic material layer, and the magnetic field is externally applied to this three-layer film, may cause the spin direction of the magnetic material to be changed in response to the applied magnetic field, and the voltage generated from the laminated layer part is changed by the upper and lower spin interaction effects at this time.

Such an operation that the current is flown in a film surface direction of the laminated layer film between the superconducting oxide material formed on the substrate and the magnetic oxide material, and the magnetic field is applied, may cause the spin direction of the magnetic oxide material to be changed, and also the voltage generated within the film surface is changed in response to the magnet field by the spin interaction effect via the superconducting material between the magnetic oxide materials.

When the magnetic detecting device of the present invention is employed as the means for reading out the signal stored in the magnetic recording medium, the voltage generated from the device is changed in accordance with the magnetic field applied from the magnetic recording medium to the device.

In accordance with the present invention, it is possible to provide a magnetic detecting device with a high sensitivity and a better high response characteristic. As a consequence, there is an advantage that a magnetic recording apparatus with a large memory capacity and a high recording density can be provided. Furthermore, it is possible to manufacture the magnetic detecting device as well as the magnetic recording apparatus with better reproducibility.

According to the present invention, there are particular advantages that the magnetic field produced from the vertical magnetic recording medium can be read out without employing the complex optical system which has been utilized in the conventional device, and the access time can be reduced less than 1/10 of the conventional access time.

Also, in accordance with the present invention, since the magnetic detecting device with utilizing the spin interaction effect at the room temperature can be provided, there is another advantage that a cooling system is no longer required.

Furthermore, since the large reproduced output can be obtained even when the current value used to detect the voltage is reduced in accordance with the present invention, there is a merit to prevent deterioration in the device caused by the heating effects.

Moreover, in accordance with the present invention, since the reproduced output is large, there is another merit that no adverse influence by the noise produced during the signal reproduction is given to the magnetic detecting device.

11

Figure 2:
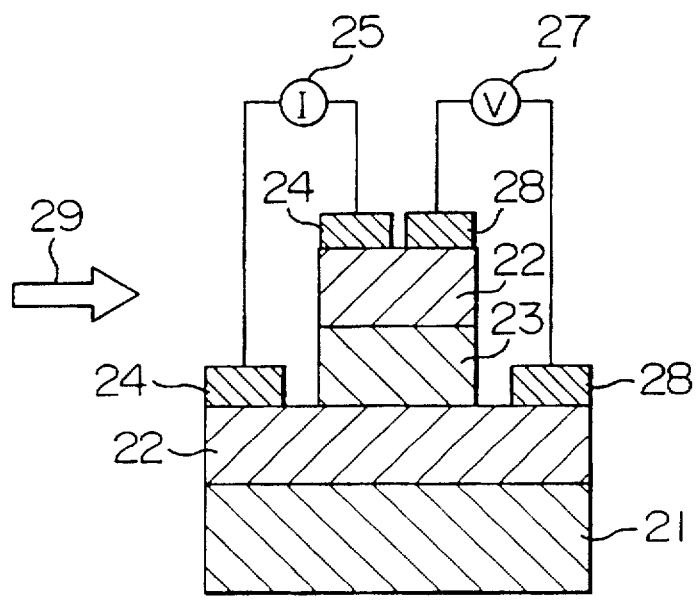

FIG. 2 is a sectional view of a magnetic detecting device according to the present invention.

Figure 3:
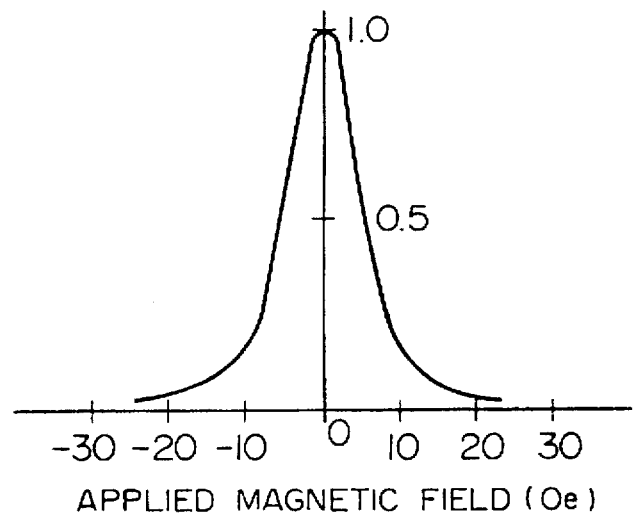

FIG. 3 is a diagram for representing a voltage variation of the magnetic detecting device according to the present invention with respect to the applied magnetic field.

Figure 4:
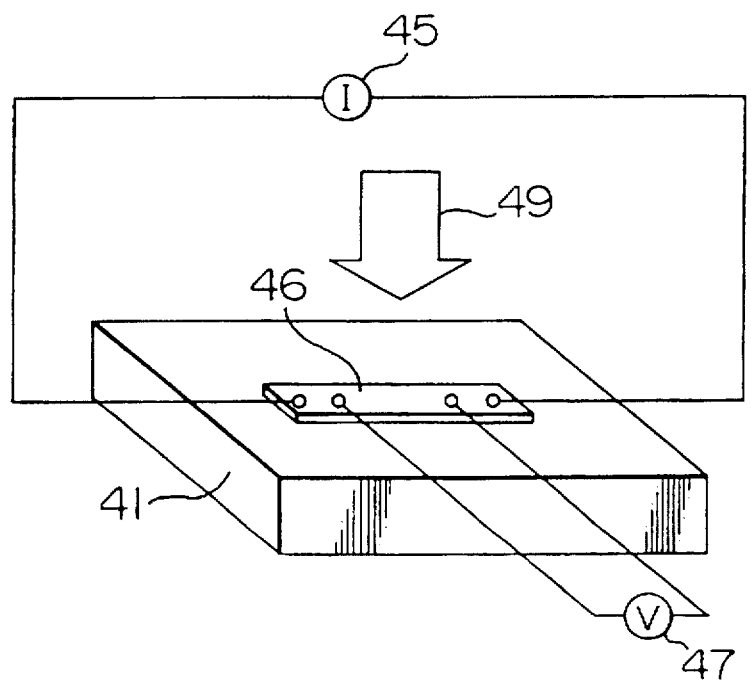

FIG. 4 is a schematic diagram of another magnetic detecting device according to the present invention.

Figure 5:
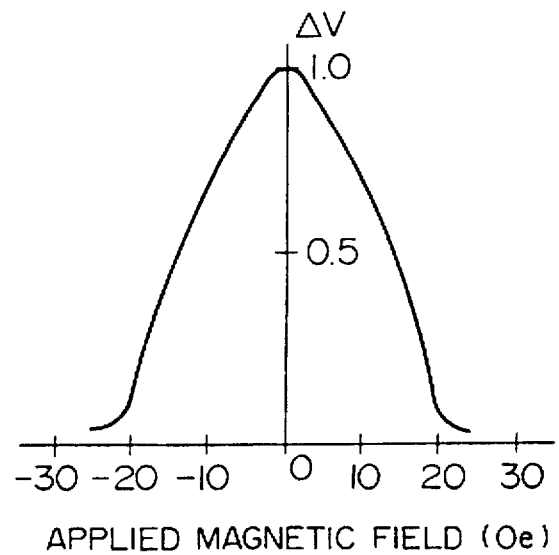

FIG. 5 is a diagram for indicating a voltage variation of another magnetic detecting device according to the present invention with respect to the applied magnetic field.

Figure 6:
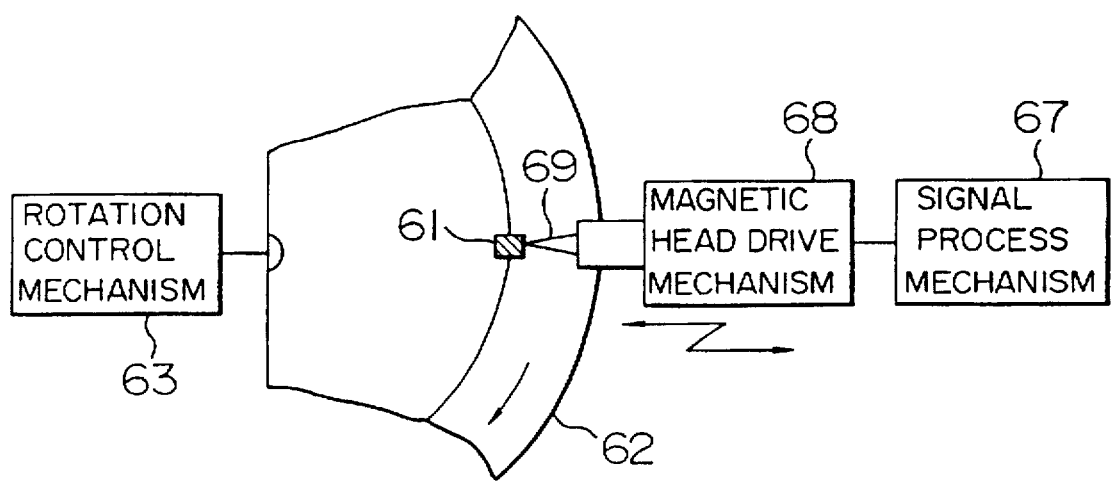

FIG. 6 shows a constructive diagram of a magnetic recording apparatus according to the present invention.

Figure 7:
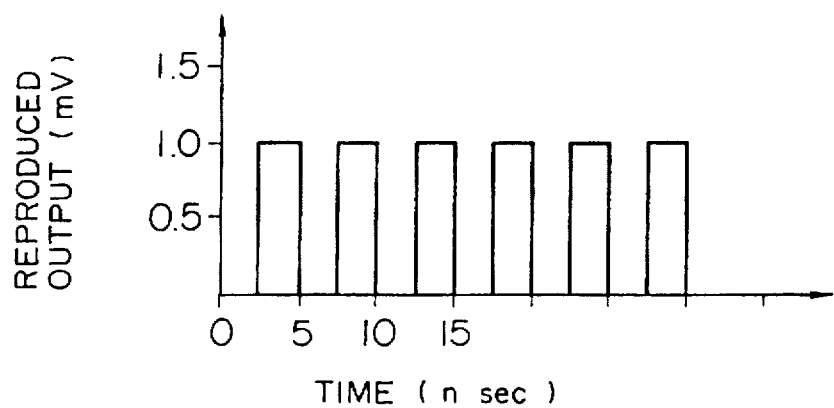

FIG. 7 is a waveform diagram f a reproduced output of the magnetic recording apparatus according to the present invention.

Figure 8:
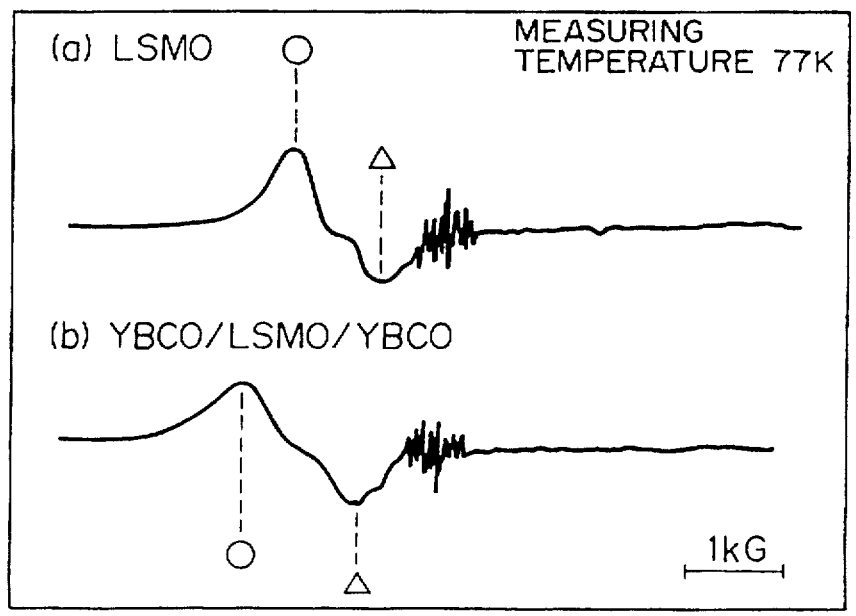

FIG. 8 represents a spin condition.

Figure 9:
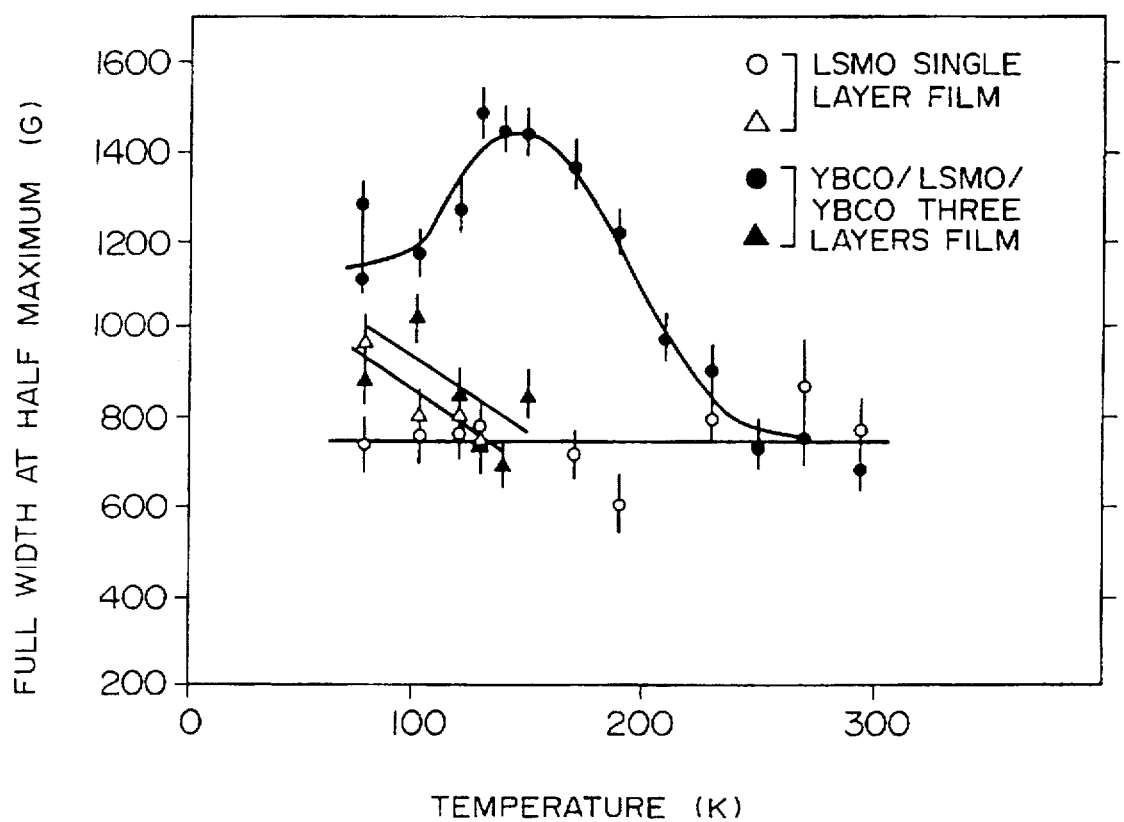

FIG. 9 represents a relationship between a full width at half maximum and a temperature.

DESCRIPTION OF THE PREFERRED EMBODIMENTS

Figure 1:
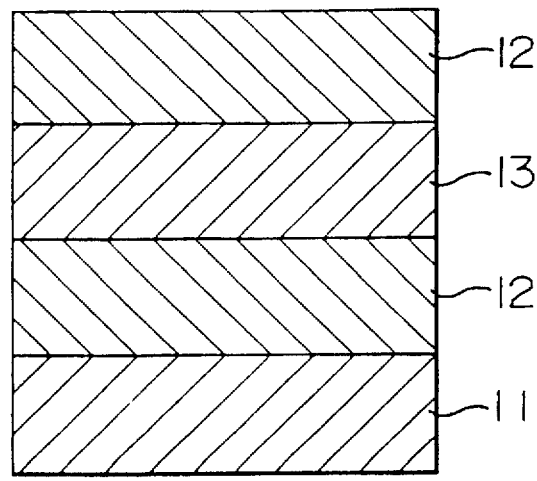
FIG. 1 is a sectional view of a laminated-layer film with a three-layer structure.

Referring now to FIG. 1, one preferred embodiment of the present invention will be described.

FIG. 1 is a sectional view of a laminated film with a three-layer structure formed on a substrate 11. In FIG. 1, reference numeral 12 indicates a magnetic material (substance), and reference numeral 13 denotes an intermediate layer. In this case, $YBa_2Cu_3Oy$ (symbol "y" is selected from 6.0 to 710) is used as the intermediate layer 13, and $La_{0.7}Ca_{0.15}Sr_{0.15}MnOz$ (symbol "z" is selected from 2.7 to 3.3) corresponding to the magnetic oxide material is employed as the magnetic material 12. Then, a monocrystal polished like a mirror is employed as the substrate 11.

The thickness of the layers for this laminated film with such a 3-layer structure were so designed that the intermediate layer 13 had the thickness of 200 nm, and the magnetic material layer 12 has the thickness of 200 nm, which were formed on the substrate 11 of $SrTiO_3$ (100) at 10×10×0.5.

The respective layers were fabricated under such conditions shown in a table 1.

TABLE 1

| target | $YBa_2Cu_3Oy$ $YBa_{2.5}Cu_{5.0}Oy$ | $La_{0.7}Ca_{0.15}Sr_{0.15}MnO_z$ $La_{0.7}Ca_{0.15}Sr_{0.15}MnO_z$ |
|---|---|---|
| substrate temperature (°C.) | 650 | 630 |
| sputtering gas (Ar/O2) | 15/5 | 9/1 |
| sputtering pressure (mTorr) | 12 | 12 |
| RF ppower (W) | 125 | 150 |
| glowing speed (nm/s) | 0.07 | 0.21 |
| film thickness (nm) | 200 | 20, 30, 50, 100 |

In FIG. 2, there is shown such an example that this laminated film with the three-layer structure has been applied to a magnetic detecting device. FIG. 2 is a schematic sectional view of this magnetic detecting device.

The magnetic detecting device shown in FIG. 2 is fabricated by way of a manner similar to the above manner in such a way that a magnetic oxide material 22 of $La_{0.7}Ca_{0.15}Sr_{0.15}MnO_z$ (symbol "z" is 2.7 to 3.3), an intermediate layer 23 of $YBa_2Cu_3O_y$ (symbol "y" is 6.5 to 7.0),

12 and also a magnetic oxide material 22 of $La_{0.7}Ca_{0.15}Sr_{0.15}MnO_z$ (symbol "z" is 2.7 to 3.3), are sequentially formed on the substrate 21 made of a Si single crystal substrate.

Electrodes 24 made of Au (gold) and for supplying currents are formed on the respective magnetic materials 22 between the respective magnetic materials 22. In FIG. 2, reference numeral 25 indicates a current source used to supply the current from the electrode 24, so that the current of 20 microamperes is flown from the upper magnetic material layer to the lower magnetic material layer.

An electrode 28 made of Au is formed in order that a voltage generated at the three-layer laminated portion by supplying the current between the magnetic materials 22 can be detected by a voltmeter 27.

When a magnetic field 29 (indicated by an arrow of FIG. 2) is applied to this device within a range of −30 to 30 Oersteds along a direction parallel to the film surface of the intermediate layer 23, the voltage between the magnetic materials 22 is changed in response to this magnetic field 29.

The changes in the voltages generated in accordance with the applied magnetic field are shown in FIG. 3. An abscissa of FIG. 3 shows the applied magnetic field, whereas an ordinate of FIG. 3 represents a voltage variation "ΔV" under such a condition that a voltage generated by applying no magnetic field is used as a reference value. For instance, the voltage change ΔV of 0.5 implies that a half of voltage when no magnetic field is applied, is generated. As seen from FIG. 3, if the external magnetic field is varied by 10 Oersteds, a voltage is varied by 0.85. This variation value is greater than that of the conventional magnetic resistance device, with employment of, for instance, a permalloy magnetic film, by approximately 2 orders. It is possible to provide a magnetic detecting device having a high sensitivity when this characteristic is utilized.

Referring now to FIG. 4, another preferred embodiment of the present invention will be described. FIG. 4 schematically illustrates a magnetic resistance effect device according to the present invention. The magnetic resistance effect device shown in FIG. 4 is fabricated in such a manner that a laminated film 46, according to the present invention, is processed on a substrate 41 made of a MgO monocrystal by way of the photolithography and ion milling methods in a form having an aspect ratio of 50×200 micrometers. The laminated film 46 is so manufactured that a superconducting oxide $Tl_2Ba_2Ca_2Cu_3O_{10}$ having a thickness of 100 nm is laminated on a magnetic oxide material $La_{0.7}Ca_{0.3}NiO_z$ (symbol "z" is 2.7 to 3.3) by way of the RF magnetron sputtering method, and furthermore, a magnetic oxide material $La_{0.7}Ca_{0.3}NiO_z$ (symbol "z" is 2.7 to 3.3) having a thickness of 100 nm is laminated by way of the RF magnetron sputtering method. In FIG. 4, reference numeral 45 denotes a current source which supplies a current of 20 μA from an electrode to a film surface direction of the laminated film 46. Reference numeral 47 denotes a voltmeter capable of detecting a voltage generated in the laminated film 46. When a magnetic field 49 was applied in a range of −30 to 30 Oersteds along a vertical direction with respect to this magnetic resistance device in the film surface direction, the voltage detected in response to the strengths of the magnetic field was changed. In FIG. 5, there is shown a variation condition of the voltage generated in response to this applied magnetic field. An abscissa of FIG. 5 represents the strengths of the applied magnetic field, whereas an ordinate of FIG. 5 indicates a change rate ΔV of the voltage in response to changes in the strengths of the applied magnetic field. For instance, with regard to the magnetic field of 20

Oersteds, this change rate ΔV becomes 0.9. In other words, the voltage produced under this magnetic field of 20 Oersteds is reduced by 90% with respect to the voltage produced at a zero field. This voltage change according to the present invention is a great value more than 1 order, as compared with that of the conventional magnetic resistance device. It is possible to realize a magnetic detecting device with a high sensitivity and a high output by utilizing the laminated film according to the present invention.

A description will now be made of such a preferred embodiment that the magnetic detecting device according to the present invention is used in a magnetic recording apparatus. FIG. 6 schematically illustrates a construction of the magnetic recording apparatus. The magnetic recording apparatus shown in FIG. 6 records information on a magnetic recording medium 62, reproduces the information recorded on the medium, or overwrites another information on the first-mentioned information. A magnetic recording medium 62 is rotated at a constant circumferential speed by a rotation control mechanism 63. A magnetic head 61 for recording/reproducing information on the magnetic recording medium 62 has a common function as the magnetic detecting device and the writing magnetic head, so-called "a read/write separating type head". This magnetic head 61 having two functions as the magnetic detecting device and the writing magnetic head, is mounted on a supporting member 69. The supporting member 69 is driven by a magnetic head drive mechanism 68, so that the magnetic head 61 is moved to an arbitrary place on the magnetic recording medium 62.

When the information recorded on this magnetic recording medium 62 is read out, the magnetic head 61 is moved to the position of the magnetic recording medium 62 on which the information has been recorded, so as to detect a magnetic field.

After being moved to the certain position, the magnetic head 61 reads out the information written on the magnetic recording medium 62 in accordance with the following basic idea. On the magnetic recording medium 62, information of "1" or "0" in accordance with the direction of the magnetic field has been written. To the magnetic head 61 equipped with the magnetic detecting device, which has been moved to the reading position by the drive mechanism 68, a magnetic field is applied in accordance with the information written into the magnetic recording medium 62. At this time, the voltage produced in the laminated film of the magnetic detecting device is varied, and then, the information recorded on the magnetic recording medium can be read out by reading this voltage change by the process mechanism 67 for the recording/reproducing signals.

A reproduced output from the magnetic recording apparatus of the present invention is shown in FIG. 7. FIG. 7 shows a relationship between the reproduced output and the time.

As apparent from FIG. 7, the reproduced output of the signal becomes 1 mV, namely a high value with respect to the magnetic recording medium on which the signals "1" and "0" have been alternately recorded in a time period of 5 nsec. Since the magnetic detecting device according to the present invention is realized based upon the specific principle different from that of the conventional magnetic detecting device, there is no noise caused by movements of the magnetic domain. Since the reproduced output owns the very sharp rising edge, the magnetic detecting device according to the present invention may reproduce a high frequency signal over 1 GHz.

Furthermore, the magnetic detecting device according to the present invention may be employed as a magnetic detecting device used for a vertical magnetic recording medium. The conventional vertical magnetic recording medium is so-called as "a photoelectro-magnetic recording medium" which employs such a reading method that the ken effect is utilized. In the ken effect, a phenomenon to polarize light by magnetization is used to read the information.

There is shown a preferred embodiment in which the magnetic detecting device according to the present invention has been employed as a magnetic head for reading a vertical magnetic recording medium. The magnetic detecting device of the present invention has a laminated film with a three-layer structure in which a superconducting oxide material $YBa_2Cu_3O_y$ (symbol "y" is 6.5 to 7.0) having a film thickness of 100 nm is sandwiched by magnetic oxide materials $La_{0.7}Ca_{0.3}CoO_z$ (symbol "z" denotes 2.7 to 3.3) each having a thickness of 200 nm. This magnetic detecting device is mounted on a supporting member. A magnetic field produced from the vertical magnetic recording medium is applied to the film surface of the laminated film along a parallel direction thereto. The magnetic recorded information can be read by rotating this vertical magnetic recording medium at a constant circumferential speed. It is possible to provide a magnetic recording/reproducing apparatus with a simple construction b employing the magnetic detecting device of the present invention, as compared with the conventional magnetic recording/reproducing apparatus with the vertical magnetic recording medium. As a result, the access time for reading the information may be shortened by 1/10, or lower than the conventional access time. This is because according to the vertical magnetic recording method of the present invention, no complex optical system for the control purpose is required, and the recorded information reading unit an be moved to the reading positions at a high speed.

We claim:

1. A magnetic detecting device comprising:

a substrate;

a laminated film formed on said substrate and comprising an oxide film of perovskite structure and magnetic films of perovskite structure sandwiching said oxide film;

wherein a value of a magnetic field applied to said laminated film is measured by detecting a change of a value of resistance of said laminated film to detect a value of magnetic field.

2. A magnetic detecting device as claimed in claim 1, wherein said magnetic films of perovskite structure are made of a material selected from the group consisting of $(La,Ca)_1Mn_1O_y$, $(La,Sr)_1Mn_1O_y$, $Bi_1Mn_1O_y$, $Ba_1Fe_1O_y$, $Sr_1Co_1O_y$, $(La,A)_1B_1O_y$ (symbol "A" indicates at least one of elements Ba, Sr, Pb, Cd; symbol "B" indicates at least one of elements Mn, Co); $(La,A)_1B_1C_1O_y$ (symbol "A" indicates at least one rare-earth element; symbol "B" is at least one alkaline-earth element; symbol "C" is at least one of elements Fe, Co, Mn, Ni, Cr, Co);

$\{(Pr,Nd)_x(Ba,Sr)\}_1Mn_1O_y$, $(Bi,Ca)_1Mn_1O_y$, $La_1(N,Mn)_1O_y$ (symbol "M" indicates at least one of elements Co, Ni, Cu, Cr); $Gd(Co,Mn)_1O_y$.

$A_1(Fe,B)_1O_y$ (symbol "A" is at least one of elements Ba, Ca, Sr, symbol "B" is at least one of elements Mo, Mn);

$Bi_1Cr_1O_y$, $Ca_1Ru_1O_y$;

$A_1(B,C)_1O_y$ (symbol "A" is at least one of elements Ba, Ca, Sr, Pb, symbol "B" is at least one of elements Ni, Mn, Cr, Fe, symbol "C" is at least one of elements W, Sb, Mo, U); and (Sr, La)$_1$(C,D)$_1$O$_y$ (symbol "C" is at least one of elements Co, Ni, symbol "D" is at least one of elements Nb, Sb, Ta, symbol "y" is 2.7 to 3.3).

3. A magnetic detecting device as claimed in claim 2, wherein said oxide film of perovskite structure is made of a material selected from the group consisting of (La$_{1-x}$M$_x$)Cu$_2$O$_4$ (symbol "M" is at least one of elements Ba, Ca, Sr), La$_1$Ba$_2$Cu$_3$O$_7$, La$_2$NaCuO$_4$, La$_2$CuO$_4$, Bi$_{0.1}$La$_{1.8}$Sr$_{0.1}$CuO, La$_2$Ba$_3$LuCu$_6$O, YBa$_2$Cu$_3$O$_7$, Y$_2$Ba$_4$Ca$_8$O$_{20}$, Yb$_2$Ba$_4$Cu$_7$O$_{15}$, Bi$_2$Sr$_2$CuO$_6$, Bi$_2$Sr$_2$Ca$_1$Cu$_2$O$_8$, B$_2$Si$_8$Ca$_2$Cu$_3$O$_{10}$, Bi$_2$Sr$_2$Ca$_3$Cu$_4$O$_{12}$, Ba(Pb$_{1-x}$Bi$_x$)O$_3$, (Ba$_{1-x}$K$_x$)BiO$_3$, (Bi$_{1-x}$Pb$_x$)$_2$Sr$_2$Ca$_2$Cu$_3$O, Bi$_2$Sr$_{2.6}$Nd$_{0.4}$CuO$_8$, Tl$_2$Ba$_2$CuO$_6$, Tl$_2$Ba$_2$Ca$_1$Cu$_2$O$_8$, Tl$_2$Ba$_2$Ca$_2$Cu$_3$O$_{10}$, Tl$_1$Ba$_2$Ca$_1$Cu$_2$O$_6$, Tl$_1$Ba$_2$Ca$_3$Cu$_4$O$_8$, Tl$_1$Ba$_3$Ca$_2$Cu$_4$O$_{10}$, Tl$_1$Sr$_2$Ca$_2$Cu$_3$O$_9$, (Tl$_{0.5}$Pb$_{0.5}$)Sr$_2$Ca$_2$Cu$_3$O$_8$, Nd$_{1.6}$Sr$_{0.2}$Ce$_{0.2}$CuO$_4$, (Tl$_{0.75}$Bi$_{0.25}$)$_{1.3}$(Sr$_{0.5}$Ca$_{0.5}$)$_{2.7}$Cu$_2$O$_8$, and Pb$_2$Sr$_2$Y$_{0.5}$Ca$_{0.5}$Cu$_3$O$_8$ (Symbol "X" is 0.05 to 1.0).

4. A magnetic detecting device as claimed in claim 1, wherein said oxide film of perovskite structure is made of a material selected from the group consisting of (La$_{1-x}$M$_x$)Cu$_2$O$_4$ (symbol "M" is at least one of elements Ba, Ca, Sr), La$_1$Ba$_2$Cu$_3$O$_7$, La$_2$NaCuO$_4$, La$_2$CuO$_4$, Bi$_{0.1}$La$_{1.8}$Sr$_{0.1}$CuO, La$_2$Ba$_3$LuCu$_6$O, YBa$_2$Cu$_3$O$_7$, Y$_2$Ba$_4$Ca$_8$O$_{20}$, Yb$_2$Ba$_4$Cu$_7$O$_{15}$, Bi$_2$Sr$_2$CuO$_6$, Bi$_2$Sr$_2$Ca$_1$Cu$_2$O$_8$, B$_2$Si$_8$Ca$_2$Cu$_3$O$_{10}$, Bi$_2$Sr$_2$Ca$_3$Cu$_4$O$_{12}$, Ba(Pb$_{1-x}$Bi$_x$)O$_3$, (Ba$_{1-x}$K$_x$)BiO$_3$, (Bi$_{1-x}$Pb$_x$)$_2$Sr$_2$Ca$_2$Cu$_3$O, Bi$_2$Sr$_{2.6}$Nd$_{0.4}$CuO$_8$, Tl$_2$Ba$_2$CuO$_6$, Tl$_2$Ba$_2$Ca$_1$Cu$_2$O$_8$, Tl$_2$Ba$_2$Ca$_2$Cu$_3$O$_{10}$, Tl$_1$Ba$_2$Ca$_1$Cu$_2$O$_6$, Tl$_1$Ba$_2$Ca$_3$Cu$_4$O$_8$, T$_1$Ba$_3$Ca$_2$Cu$_4$O$_{10}$, Tl$_1$Sr$_2$Ca$_2$Cu$_3$O$_9$, (Tl$_{0.5}$Pb$_{0.5}$)Sr$_2$Ca$_2$Cu$_3$O$_8$, Nd$_{1.6}$Sr$_{0.2}$Ce$_{0.2}$CuO$_4$, (Tl$_{0.75}$Bi$_{0.25}$)$_{1.3}$(Sr$_{0.5}$Ca$_{0.5}$)$_{2.7}$Cu$_2$O$_8$, and Pb$_2$Sr$_2$Y$_{0.5}$Ca$_{0.5}$Cu$_3$O$_8$ (Symbol "X" is 0.05 to 1.0).

5. A magnetic detecting device comprising:
   a substrate;
   a laminated film formed on said substrate and comprising an oxide film of perovskite structure and magnetic films of perovskite structure sandwiching said oxide film;
   a current source for applying a current between said magnetic films; and
   a voltage detector for detecting a voltage generated between said magnetic films;
   wherein a value of magnetic field applied to said laminated film is measured by a value of a voltage generated between said magnetic films to detect magnetic field.

6. A magnetic detecting device as claimed in claim 5, wherein said magnetic films of perovskite structure are made of a material selected from the group consisting of (La,Ca)$_1$Mn$_1$O$_y$, (La,Sr)$_1$Mn$_1$O$_y$, Bi$_1$Mn$_1$O$_y$, Ba$_1$Fe$_1$O$_y$, Sr$_1$Co$_1$O$_y$, (La,A)$_1$B$_1$O$_y$ (symbol "A" indicates at least one of elements Ba, Sr, Pb, Cd; symbol "B" indicates at least one of elements Mn, Co); (La,A)$_1$B$_1$C$_1$O$_y$ (symbol "A" indicates at least one rare-earth element; symbol "B" is at least one alkaline-earth element; symbol "C" is at least one of elements Fe, Co, Mn, Ni, Cr, Co);
   {(Pr,Nd),(Ba,Sr)}$_1$Mn$_1$O$_y$, (Bi,Ca)$_1$Mn$_1$O$_y$, La$_1$(N,Mn)$_1$O$_y$ (symbol "M" indicates at least one of elements Co, Ni, Cu, Cr); Gd(Co,Mn)$_1$O$_y$,
   A$_1$(Fe,B)$_1$O$_y$ (symbol "A" is at least one of elements Ba, Ca, Sr, symbol "B" is at least one of elements Mo, Mn); Bi$_1$Cr$_1$O$_y$, Ca$_1$Ru$_1$O$_y$;
   A$_1$(B,C)$_1$O$_y$ (symbol "A" is at least one of elements Ba, Ca, Sr, Pb, symbol "B" is at least one of elements Ni, Mn, Cr, Fe, symbol "C" is at least one of elements W, Sb, Mo, U); and
   (Sr, La)$_1$(C,D)$_1$O$_y$ (symbol "C" is at least one of elements Co, Ni, symbol "D" is at least one of elements Nb, Sb, Ta, symbol "y" is 2.7 to 3.3).

7. A magnetic detecting device as claimed in claim 6, wherein said oxide film of perovskite structure is made of a material selected from the group consisting of (La$_{1-x}$M$_x$)Cu$_2$O$_4$ (symbol "M" is at least one of elements Ba, Ca, Sr), La$_1$Ba$_2$Cu$_3$O$_7$, La$_2$NaCuO$_4$, La$_2$CuO$_4$, Bi$_{0.1}$La$_{1.8}$Sr$_{0.1}$CuO, La$_2$Ba$_3$LuCu$_6$O, YBa$_2$Cu$_3$O$_7$, Y$_2$Ba$_4$Ca$_8$O$_{20}$, Yb$_2$Ba$_4$Cu$_7$O$_{15}$, Bi$_2$Sr$_2$CuO$_6$, Bi$_2$Sr$_2$Ca$_1$Cu$_2$O$_8$, B$_2$Si$_8$Ca$_2$Cu$_3$O$_{10}$, Bi$_2$Sr$_2$Ca$_3$Cu$_4$O$_{12}$, Ba(Pb$_{1-x}$Bi$_x$)O$_3$, (Ba$_{1-x}$K$_x$)BiO$_3$, (Bi$_{1-x}$Pb$_x$)$_2$Sr$_2$Ca$_2$Cu$_3$O, Bi$_2$Sr$_{2.6}$Nd$_{0.4}$CuO$_8$, Tl$_2$Ba$_2$CuO$_6$, Tl$_2$Ba$_2$Ca$_1$Cu$_2$O$_8$, Tl$_2$Ba$_2$Ca$_2$Cu$_3$O$_{10}$, Tl$_1$Ba$_2$Ca$_1$Cu$_2$O$_6$, Tl$_1$Ba$_2$Ca$_3$Cu$_4$O$_8$, Tl$_1$Ba$_3$Ca$_2$Cu$_4$O$_{10}$, Tl$_1$Sr$_2$Ca$_2$Cu$_3$O$_9$, (Tl$_{0.5}$Pb$_{0.5}$)Sr$_2$Ca$_2$Cu$_3$O$_8$, Nd$_{1.6}$Sr$_{0.2}$Ce$_{0.2}$CuO$_4$, (Tl$_{0.75}$Bi$_{0.25}$)$_{1.3}$(Sr$_{0.5}$Ca$_{0.5}$)$_{2.7}$Cu$_2$O$_8$, and Pb$_2$Sr$_2$Y$_{0.5}$Ca$_{0.5}$Cu$_3$O$_8$ (Symbol "X" is 0.05 to 1.0).

8. A magnetic detecting device as claimed in claim 5, wherein said oxide film of perovskite structure is made of a material selected from the group consisting of (La$_{1-x}$M$_x$)Cu$_2$O$_4$ (symbol "M" is at least one of elements Ba, Ca, Sr), La$_1$Ba$_2$Cu$_3$O$_7$, La$_2$NaCuO$_4$, La$_2$CuO$_4$, Bi$_{0.1}$La$_{1.8}$Sr$_{0.1}$CuO, La$_2$Ba$_3$LuCu$_6$O, YBa$_2$Cu$_3$O$_7$, Y$_2$Ba$_4$Ca$_8$O$_{20}$, Yb$_2$Ba$_4$Cu$_7$O$_{15}$, Bi$_2$Sr$_2$CuO$_6$, Bi$_2$Sr$_2$Ca$_1$Cu$_2$O$_8$, B$_2$Si$_8$Ca$_2$Cu$_3$O$_{10}$, Bi$_2$Sr$_2$Ca$_3$Cu$_4$O$_{12}$, Ba(Pb$_{1-x}$Bi$_x$)O$_3$, (Ba$_{1-x}$K$_x$)BiO$_3$, (Bi$_{1-x}$Pb$_x$)$_2$Sr$_2$Ca$_2$Cu$_3$O, Bi$_2$Sr$_{2.6}$Nd$_{0.4}$CuO$_8$, Tl$_2$Ba$_2$CuO$_6$, Tl$_2$Ba$_2$Ca$_1$Cu$_2$O$_8$, Tl$_2$Ba$_2$Ca$_2$Cu$_3$O$_{10}$, Tl$_1$Ba$_2$Ca$_1$Cu$_2$O$_6$, Tl$_1$Ba$_2$Ca$_3$Cu$_4$O$_8$, Tl$_1$Ba$_3$Ca$_2$Cu$_4$O$_{10}$, Tl$_1$Sr$_2$Ca$_2$Cu$_3$O$_9$, (Tl$_{0.5}$Pb$_{0.5}$)Sr$_2$Ca$_2$Cu$_3$O$_8$, Nd$_{0.6}$Sr$_{0.2}$Ce$_{0.2}$CuO$_4$, (Tl$_{0.75}$Bi$_{0.25}$)$_{1.3}$(Sr$_{0.5}$Ca$_{0.5}$)$_{2.7}$Cu$_2$O$_8$, and Pb$_2$Sr$_2$Y$_{0.5}$Ca$_{0.5}$Cu$_3$O$_8$ (Symbol "X" is 0.05 to 1.0).

9. A magnetic detecting device comprising:
   a substrate;
   a laminated film formed on said substrate and comprising an oxide film of perovskite structure and magnetic films of perovskite structure sandwiching said oxide film;
   a current source for applying a current to one of said magnetic films;
   a voltage detector for detecting a voltage generated within said one of said magnetic films by said current;
   wherein a value of magnetic field applied to said laminated film is measured by a value of a voltage generated within said one of said magnetic films to detect magnetic field.

10. A magnetic detecting device as claimed in claim 9, wherein said magnetic films of perovskite structure are made of a material selected from the group consisting of (La,Ca)$_1$Mn$_1$O$_y$, (La,Sr)$_1$Mn$_1$O$_y$, Bi$_1$Mn$_1$O$_y$, Ba$_1$Fe$_1$O$_y$, Sr$_1$Co$_1$O$_y$, (La,A)$_1$B$_1$O$_y$ (symbol "A" indicates at least one of elements Ba, Sr, Pb, Cd; symbol "B" indicates at least one of elements Mn, Co); (La,A)$_1$B$_1$C$_1$O$_y$ (symbol "A" indicates at least one rare-earth element; symbol "B" is at least one alkaline-earth element; symbol "C" is at least one of elements Fe, Co, Mn, Ni, Cr, Co);
   {(Pr,Nd),(Ba,Sr)}$_1$Mn$_1$O$_y$, (Bi,Ca)$_1$Mn$_1$O$_y$, La$_1$(N,Mn)$_1$O$_y$ (symbol "M" indicates at least one of elements Co, Ni, Cu, Cr); Gd(Co,Mn)$_1$O$_y$,
   A$_1$(Fe,B)$_1$O$_y$ (symbol "A" is at least one of elements Ba, Ca, Sr, symbol "B" is at least one of elements Mo, Mn); Bi$_1$Cr$_1$O$_y$, Ca$_1$Ru$_1$O$_y$;
   A$_1$(B,C)$_1$O$_y$ (symbol "A" is at least one of elements Ba, Ca, Sr, Pb, symbol "B" is at least one of elements Ni, Mn, Cr, Fe, symbol "C" is at least one of elements W, Sb, Mo, U); and
   (Sr,La)$_1$(C,D)$_1$O$_y$ (symbol "C" is at least one of elements Co, Ni, symbol "D" is at least one of elements Nb, Sb, Ta, symbol "y" is 2.7 to 3.3).

11. A magnetic detecting device as claimed in claim 10, wherein said oxide film of perovskite structure is made of a material selected from the group consisting of $(La_{1-x}M_x)Cu_2O_4$ (symbol "M" is at least one of elements Ba, Ca, Sr), $La_1Ba_2Cu_3O_7$, $La_2NaCuO_4$, $La_2CuO_4$, $Bi_{0.1}La_{1.8}Sr_{0.1}CuO$, $La_2Ba_3LuCu_6O$, $YBa_2Cu_3O_7$, $Y_2Ba_4Ca_8O_{20}$, $Yb_2Ba_4Cu_7O_{15}$, $Bi_2Sr_2CuO_6$, $Bi_2Sr_2Ca_1Cu_2O_8$, $B_2Si_8Ca_2Cu_3O_{10}$, $Bi_2Sr_2Ca_3Cu_4O_{12}$, $Ba(Pb_{1-x}Bi_x)O_3$, $(Ba_{1-x}K_x)BiO_3$, $(Bi_{1-x}Pb_x)_2Sr_2Ca_2Cu_3O$, $Bi_2Sr_{2.6}Nd_{0.4}CuO_8$, $Tl_2Ba_2CuO_6$, $Tl_2Ba_2Ca_1Cu_2O_8$, $Tl_2Ba_2Ca_2Cu_3O_{10}$, $Tl_1Ba_2Ca_1Cu_2O_6$, $Tl_1Ba_2Ca_3Cu_4O_8$, $Tl_1Ba_3Ca_2Cu_4O_{10}$, $Tl_1Sr_2Ca_2Cu_3O_9$, $(Tl_{0.5}Pb_{0.5})Sr_2Ca_2Cu_3O_8$, $Nd_{1.6}Sr_{0.2}Ce_{0.2}CuO_4$, $(Tl_{0.75}Bi_{0.25})_{1.3}(Sr_{0.5}Ca_{0.5})_{2.7}Cu_2O_8$, and $Pb_2Sr_2Y_{0.5}Ca_{0.5}Cu_3O_8$ (Symbol "X" is 0.05 to 1.0).

12. A magnetic detecting device as claimed in claim 9, wherein said oxide film of perovskite structure is made of a material selected from the group consisting of $(La_{1-x}M_x)Cu_2O_4$ (symbol "M" is at least one of elements Ba, Ca, Sr), $La_1Ba_2Cu_3O_7$, $La_2NaCuO_4$, $La_2CuO_4$, $Bi_{0.1}La_{1.8}Sr_{0.1}CuO$, $La_2Ba_3LuCu_6O$, $YBa_2Cu_3O_7$, $Y_2Ba_4Ca_8O_{20}$, $Yb_2Ba_4Cu_7O_{15}$, $Bi_2Sr_2CuO_6$, $Bi_2Sr_2Ca_1Cu_2O_8$, $B_2Si_8Ca_2Cu_3O_{10}$, $Bi_2Sr_2Ca_3Cu_4O_{12}$, $Ba(Pb_{1-x}Bi_x)O_3$, $(Ba_{1-x}K_x)BiO_3$, $(Bi_{1-x}Pb_x)_2Sr_2Ca_2Cu_3O$, $Bi_2Sr_{2.6}Nd_{0.4}CuO_8$, $Tl_2Ba_2CuO_6$, $Tl_2Ba_2Ca_1Cu_2O_8$, $Tl_2Ba_2Ca_2Cu_3O_{10}$, $Tl_1Ba_2Ca_1Cu_2O_6$, $Tl_1Ba_2Ca_3Cu_4O_8$, $Tl_1Ba_3Ca_2Cu_4O_{10}$, $Tl_1Sr_2Ca_2Cu_3O_9$, $(Tl_{0.5}Pb_{0.5})Sr_2Ca_2Cu_3O_8$, $Nd_{0.6}Sr_{0.2}Ce_{0.2}CuO_4$, $(Tl_{0.75}Bi_{0.25})_{1.3}(Sr_{0.5}Ca_{0.5})_{2.7}Cu_2O_8$, and $Pb_2Sr_2Y_{0.5}Ca_{0.5}Cu_3O_8$ (Symbol "X" is 0.05 to 1.0).

13. A magnetic recording apparatus comprising a magnetic recording medium and a magnetic detecting device as claimed in claim 1, wherein a magnetic signal recorded in said magnetic recording medium is read out by said magnetic detection device.

* * * * *